United States Patent
Chowdhary et al.

(10) Patent No.: US 10,641,625 B2
(45) Date of Patent: May 5, 2020

(54) METHOD AND APPARATUS FOR CALIBRATING A MAGNETIC SENSOR

(71) Applicant: CSR TECHNOLOGY HOLDINGS INC., San Jose, CA (US)

(72) Inventors: Mahesh Chowdhary, San Jose, CA (US); Mahaveer Jain, Rajasthan (IN)

(73) Assignee: CSR Technology Holdings Inc., San Diego, CA (US)

( * ) Notice: Subject to any disclaimer, the term of this patent is extended or adjusted under 35 U.S.C. 154(b) by 1325 days.

(21) Appl. No.: 14/473,388

(22) Filed: Aug. 29, 2014

(65) Prior Publication Data

US 2015/0081242 A1 Mar. 19, 2015

Related U.S. Application Data

(63) Continuation of application No. 12/757,908, filed on Apr. 9, 2010, now Pat. No. 8,825,426.

(51) Int. Cl.
G01D 18/00 (2006.01)
G01C 17/38 (2006.01)
G01R 33/00 (2006.01)

(52) U.S. Cl.
CPC ........... *G01D 18/004* (2013.01); *G01C 17/38* (2013.01); *G01R 33/0035* (2013.01)

(58) Field of Classification Search
CPC .............................. G01D 18/004; G01C 17/38
See application file for complete search history.

(56) References Cited

U.S. PATENT DOCUMENTS

| | | | |
|---|---|---|---|
| 4,414,753 A | 11/1983 | Moulin et al. | |
| 5,046,031 A | 9/1991 | Wanous | |
| 5,644,225 A | 7/1997 | Alfors et al. | 324/202 |
| 5,737,226 A | 4/1998 | Olson et al. | 701/224 |
| 6,301,794 B1 | 10/2001 | Parks et al. | 33/356 |
| 6,356,851 B1 | 3/2002 | Young et al. | 702/92 |
| 6,643,941 B2 | 11/2003 | Parks et al. | 33/356 |
| 6,750,644 B1 | 6/2004 | Berkcan | 324/117 R |

(Continued)

FOREIGN PATENT DOCUMENTS

| | | |
|---|---|---|
| CN | 101393022 | 3/2009 |
| GB | 2388195 | 11/2003 |

(Continued)

OTHER PUBLICATIONS

Search Report dated Aug. 5, 2015 in corresponding GB1105901.1.

(Continued)

*Primary Examiner* — Janet L Suglo
(74) *Attorney, Agent, or Firm* — Thien T. Nguyen (57) ABSTRACT

In general, the invention relates to an algorithm and process for automated and/or continuous calibration of magnetic sensor, for example such as a sensor installed in a mobile positioning system handset. According to certain aspects, the calibration process can use the normal motion of the handset such that all measurement data from the three orthogonal axes of sensor when exposed to Earth's magnetic field is collected. According to still further aspects, the process includes fitting measurement data to an ellipsoid that characterizes the actual magnetic field measurements from a magnetic sensor, so that anomalies such as hard iron effect, soft iron effect and scale factors can be extracted and/or corrected by comparison to a sphere represented by magnetic field data from a model at the sensor's location.

38 Claims, 4 Drawing Sheets

(56) References Cited

U.S. PATENT DOCUMENTS

| | | |
|---|---|---|
| 6,760,678 B1 | 7/2004 | Hon et al. |
| 6,857,194 B2 | 2/2005 | Parks et al. .............. 33/356 |
| 6,964,108 B2 | 11/2005 | Parks et al. .............. 33/356 |
| 7,119,533 B2 | 10/2006 | Tamura et al. .............. 324/202 |
| 7,127,823 B2 | 10/2006 | Parks et al. .............. 33/356 |
| 7,181,857 B2 | 2/2007 | Lee et al. .............. 33/356 |
| 7,259,550 B2 | 8/2007 | Bergsma .............. 324/202 |
| 7,353,614 B2 | 4/2008 | Parks et al. .............. 33/356 |
| 7,458,166 B2 | 12/2008 | Parks et al. .............. 33/356 |
| 7,613,581 B2 | 11/2009 | Skvortsov et al. .............. 702/92 |
| 8,370,097 B2 | 2/2013 | Patel et al. |
| 8,825,426 B2 | 9/2014 | Chowdhary et al. |
| 2003/0023380 A1 | 1/2003 | Woloszyk et al. |
| 2004/0123475 A1 | 7/2004 | Parks et al. .............. 33/356 |
| 2005/0073302 A1 | 4/2005 | Hibbs et al. .............. 324/247 |
| 2005/0091861 A1 | 5/2005 | Parks et al. .............. 33/356 |
| 2006/0026849 A1 | 2/2006 | Lee et al. .............. 33/356 |
| 2006/0059976 A1 | 3/2006 | Simonenko et al. .............. 73/1.38 |
| 2006/0075646 A1 | 4/2006 | Parks et al. .............. 33/356 |
| 2006/0122800 A1 | 6/2006 | Haverkamp et al. |
| 2006/0164073 A1 | 7/2006 | Bergsma .............. 324/202 |
| 2006/0288597 A1 | 12/2006 | Parks et al. .............. 33/356 |
| 2007/0163132 A1 | 7/2007 | Parks et al. .............. 33/356 |
| 2008/0036450 A1 | 2/2008 | Kahlman et al. .............. 324/202 |
| 2008/0071492 A1 | 3/2008 | Skvortsov et al. .............. 702/92 |
| 2008/0129281 A1 | 6/2008 | Lemp .............. 324/202 |
| 2008/0129282 A1 | 6/2008 | Lemp .............. 324/202 |
| 2008/0246470 A1 | 10/2008 | Kahlman et al. .............. 324/234 |
| 2009/0001965 A1 | 1/2009 | Ausserlechner et al. ..... 324/202 |
| 2009/0070056 A1 | 3/2009 | Vocali et al. .............. 702/92 |
| 2009/0070057 A1 | 3/2009 | Hirobe et al. .............. 702/92 |
| 2009/0072815 A1 | 3/2009 | Kahlman et al. .............. 324/202 |
| 2009/0167295 A1 | 7/2009 | Chen et al. .............. 324/202 |
| 2009/0243594 A1 | 10/2009 | Kahlman et al. .............. 324/202 |
| 2009/0273340 A1 | 11/2009 | Stephanson et al. ......... 324/202 |
| 2009/0292496 A1 | 11/2009 | Schierbeek et al. |
| 2010/0176952 A1 | 7/2010 | Bajcsy et al. |

FOREIGN PATENT DOCUMENTS

| | | |
|---|---|---|
| GB | 2388195 A | 11/2003 |
| JP | 2005-345388 | 12/2005 |
| JP | 2005345388 A | 12/2005 |
| JP | 2008-241675 | 10/2008 |
| JP | 2008241675 A | 10/2008 |
| WO | WO 2007/026238 | 3/2007 |

OTHER PUBLICATIONS

Kao, Wei-Wen, et al., "Adaptive and Learning Calibration of Magnetic Compass", Measurement Science and Technology, Institute of Physics Publishing, vol. 17, No. 11, published Oct. 13, 2006, pp. 3073-3082.

Zhang, X., et al., "A Novel Auto-Calibration Method of the Vector Magnetometer", Proc. of the Ninth International Conf. on Electronic Measurement and Instruments, IEEE, 2009, pp. 1-145 to 1-150.

GB1105901.1 Search Report under section 17; dated Aug. 4, 2011.

METHOD AND APPARATUS FOR CALIBRATING A MAGNETIC SENSOR

CROSS REFERENCE TO RELATED APPLICATIONS

This application is a Continuation of U.S. patent application Ser. No. 12/757,908, filed Apr. 9, 2010, (Now U.S. Pat. No. 8,825,426), the contents of which are incorporated herein by reference in their entirety.

FIELD OF THE INVENTION

The present invention is related to location positioning systems, and more particularly, to a method and apparatus of automatically calibrating a magnetic sensor associated with a location positioning system or other device.

BACKGROUND OF THE INVENTION

With the development of radio and space technologies, several satellite-based navigation systems (i.e. satellite positioning system or "SPS") have already been built and more will be in use in the near future. SPS receivers, such as, for example, receivers using the Global Positioning System ("GPS"), also known as NAVSTAR, have become commonplace. Other examples of SPS systems include but are not limited to the United States ("U.S.") Navy Navigation Satellite System ("NNSS") (also known as TRANSIT), the Russian counterpart to NAVSTAR known as the Global Navigation Satellite System ("GLONASS") and any future Western European SPS such as the proposed "Galileo" program. As an example, the U.S. NAVSTAR GPS system is described in GPS Theory and Practice, Fifth ed., revised edition by Hofmann-Wellenhof, Lichtenegger and Collins, Springer-Verlag Wien NewYork, 2001, which is fully incorporated herein by reference.

The U.S. GPS system was built and is operated by the United States Department of Defense. The system uses twenty-four or more satellites orbiting the earth at an altitude of about 11,000 miles with a period of about twelve hours. These satellites are placed in six different orbits such that at any time a minimum of six satellites are visible at any location on the surface of the earth except in the polar region. Each satellite transmits a time and position signal referenced to an atomic clock. A typical GPS receiver locks onto this signal and extracts the data contained in it. Using signals from a sufficient number of satellites, a GPS receiver can calculate its position, velocity, altitude, and time (i.e. navigation solution).

GPS and other satellite based navigational systems have some limitations such as the availability of a sufficient number of satellite signals. Satellite signals are sometimes not available in deep canyons, in areas with large numbers of buildings blocking the direct satellite signals, and in dense forest areas, for example. In addition, the satellite signals can be completely blocked or greatly attenuated inside buildings. Further, tunnels and bridges can block satellite signals resulting in large jumps in the indicated position at the exit of the tunnel after new satellite signals are received.

To address these issues, other complementary methods are sometimes used with satellite navigational systems to prevent interruptions in the position information. For example, sensors such as compasses can be used to determine heading, while speedometers can detect velocity. Meanwhile, inertial measurement units (IMUs) such as gyroscopes can be used to measure changes in heading or direction. Other types of IMUs such as accelerometers are used to estimate the acceleration of the navigation system, both backwards and forwards and from side to side. A host of similar devices can be used to improve the accuracy and the consistency of a navigation system such as those using GPS.

Accordingly, after the position of a system is initially determined, the sensors and/or IMUs allow the position to be determined as the system moves, even if the satellite signals are blocked. The determination of the position based on measuring the system's movement is known as dead reckoning (i.e. inertial navigation). The accuracy of a dead reckoning position and how long it remains accurate depends on various factors such as the quality of the sensors and how well they are calibrated. In some systems dead reckoning is also used to improve the accuracy of the satellite location determinations.

One type of device that can be used to assist in inertial navigation and/or dead reckoning is a magnetometer. Good calibration of such a magnetic sensor is very important for proper utilization of measured earth magnetic field data to accurately derive the heading angle. Accurately computing heading angle from magnetic sensor data is affected by factors such as the soft iron effect, hard iron effect, magnetic anomalies and other disturbances from surrounding environment.

Existing calibration processes are typically manually performed and require that the magnetic sensor is rotated by 360 degrees in two perpendicular planes while the measurement data is collected. Techniques such as the Minimum Volume Enclosing Ellipse (MVEE) method are then used for calibrating hard-iron effect and scale factor errors. The Extended Kalman filter is also used but the performance is limited by the accuracy of local inclination of magnetic field and the initial heading. Moreover, a method of continuous automated calibration of magnetic sensor has not been addressed in the prior art.

A need exists, therefore, for continuous calibration of a magnetic sensor that will have minimal requirement for the user action to collect measurement data to be used for calibration.

SUMMARY OF THE INVENTION

The present invention is related to location positioning systems, and more particularly, to a method and apparatus for calibrating a magnetic sensor for use in a positioning system. According to one aspect, the invention includes a process for automated continuous calibration of a magnetic sensor, for example installed inside a mobile positioning system handset.

According to further aspects, the process can automatically use magnetic sensor data and accelerometer data collected during normal uses involving mobile handsets. One such example is motion to remove the handset from a pocket (or holster), viewing the screen and placing the phone next to ear to make a phone call. Accordingly, the calibration process can use the normal motion of the motion handset such that all measurement data from the three orthogonal axes of sensor when exposed to Earth's magnetic field is collected, without requiring manual manipulation of the sensor for calibration.

According to still further aspects, the process includes fitting measurement data to an ellipsoid that characterizes the actual magnetic field measurements from a magnetic sensor, so that anomalies such as hard iron effect, soft iron effect and scale factors can be extracted and/or corrected by comparison to a sphere represented by magnetic field data from a model at the sensor's location.

In furtherance of the above and other aspects, a method for calibrating a magnetic sensor according to embodiments of the invention includes obtaining error-free magnetic field values for a location, obtaining magnetic field measurements from the magnetic sensor corresponding to the location, fitting the obtained magnetic field measurements to an ellipsoid, and extracting calibration values using the ellipsoid and obtained error-free magnetic field values.

In additional furtherance of the above and other aspects, a method according to embodiments of the invention includes using a magnetic sensor to obtain a heading, and automatically calibrating the magnetic sensor during ordinary motion of a device incorporating the magnetic sensor.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

In general, the invention relates to an algorithm and process for automated and/or continuous calibration of magnetic sensor, for example such as a sensor installed in a mobile positioning system handset. According to certain aspects, the calibration process can use the normal motion of the handset such that all measurement data from the three orthogonal axes of sensor when exposed to Earth's magnetic field is collected. Although the invention will be described below in conjunction with an example application in location positioning systems such as mobile handsets (e.g. cell phones or personal navigation devices or PNDs), the invention is not limited to such an application. Rather, the invention can find use in various other applications where similar magnetic sensors are used, either with or without other types of positioning system sensors such as GPS receivers. For example, the invention can be used in conjunction with a magnetic sensor that provides heading, pitch and roll angles for augmented reality display type applications. Moreover, the invention can be used to calibrate accelerometers. Those skilled in the art will appreciate various types of applications for the invention after being taught by the present disclosure.

Figure 1:
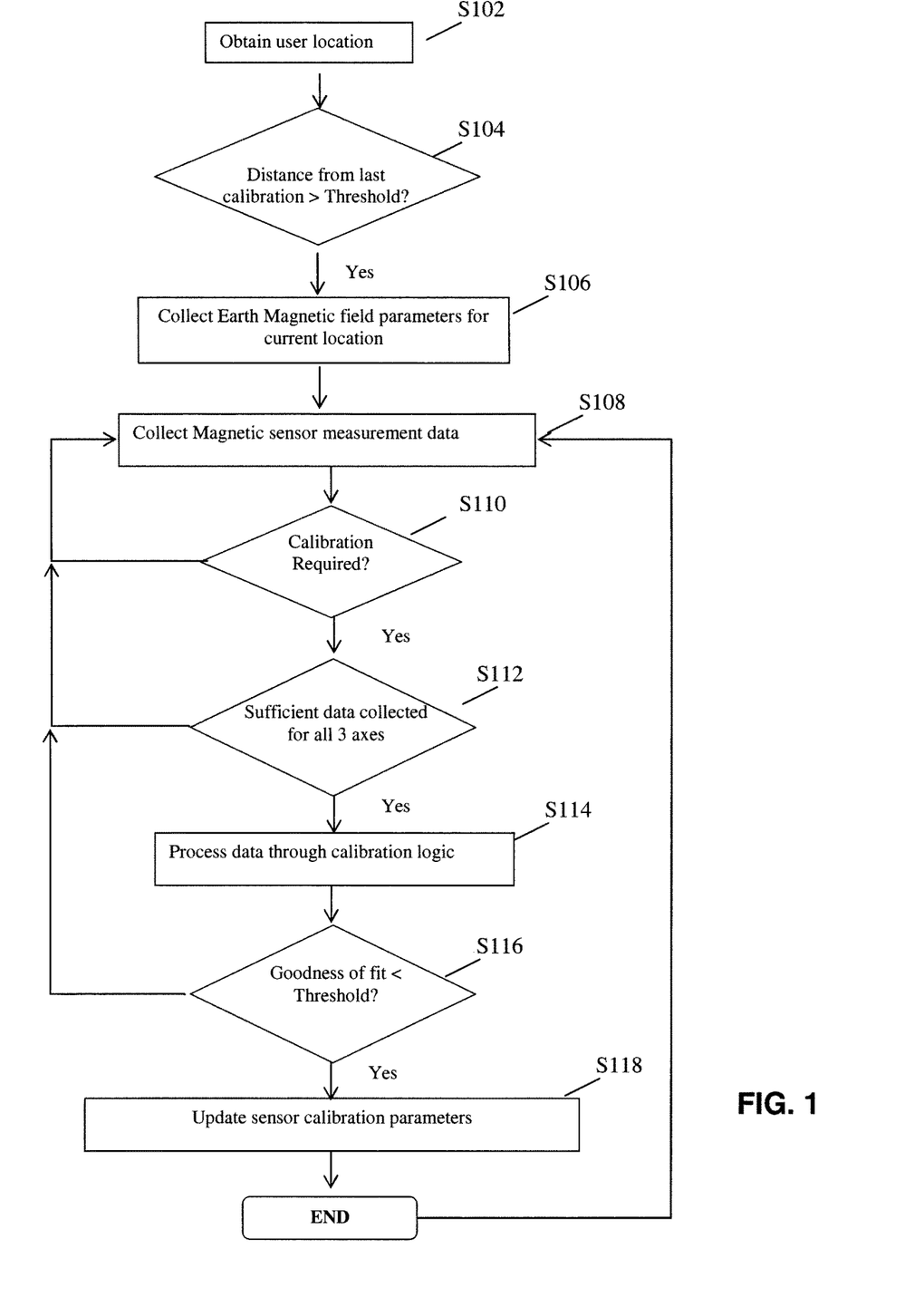
FIG. 1 is a flowchart illustrating an example process for calibrating a magnetic sensor according to principles of the invention.

FIG. 1 illustrates aspects of an example automated calibration process according to embodiments of the invention.

According to aspects of the invention, the process can be initiated in many different ways. For example, initiation can be a scheduled event, or a non-scheduled event such as turning the handset power on, the handset being accelerated or picked up, or the loss of GPS signal when navigating. Other examples include a handset cold start (i.e. any time there are no calibration parameters stored in memory, user action to force calibration, or a factory reset. Other possibilities and variations will be described below and/or will occur to those skilled in the art after being taught by these examples.

As shown in FIG. 1, the process begins in S102 with determining the current location. This can be done in many and various ways, either alone or in combination. For example, the location can be obtained by using a most recent GPS determined solution, determining a location of the current cell ID, looking up the location on a map, asking a user to input a location, etc. Other means for obtaining location include WiFi based positioning (e.g. triangulation using mapped WiFi access points, or triangulation using beacons or pseudolites). Those skilled in the art will appreciate various other alternatives.

In S104, the current location is compared to a previous calibration location to determine whether the user has moved a distance greater than a predetermined threshold (e.g. a 10 mile radius) from the last calibration location. If so, the calibration process continues. Otherwise, in some embodiments it is assumed that calibration is not needed until the predetermined distance is exceeded, and it is possible to stall the process here until that event occurs. It should be appreciated that there can be other calibration-needed criteria other than or in addition to location, such as time since last calibration, accuracy of model, etc. These alternatives will become more apparent from the descriptions herein and below.

In S106, the calibration process continues by obtaining magnetic field parameters for the current location using a magnetic model. In one example embodiment, a World magnetic model such as the International Geomagnetic Reference Field (IGRF) is used. IGRF is maintained by the National Oceanographic and Atmospheric Administration, and information regarding IGRF can be obtained at: http://www.ngdc.noaa.gov/IAGA/vmod/igrf.html). Such a magnetic model requires location in latitude, longitude, altitude and time (year, month, day) as inputs to compute the magnetic field parameters for the location, which inputs are obtained from the preceding steps. The outputs from such a magnetic model include: a) declination angle; b) inclination angle; c) horizontal field strength; d) North component; e) East component; f) Down component; and g) Total field strength.

In S108, the process causes magnetic sensor measurements to be collected. To collect meaningful data, all three axes ($M_x$, $M_y$, $M_z$) preferably should be exposed to earth magnetic field vector for some amount of time. Acceleration data can be used for this determination. For example, if the measured acceleration on all three axes of an accelerometer exceeds, for example, 0.4 g, then it would mean a significant component of gravity vector has been applied to that axis. The resulting motion would then expose all three axes of the magnetic sensor to a significant component of earth magnetic field vector.

According to aspects of the invention, the data collection can occur automatically and without a user needing to perform directed tasks. For example, when a handset such as a cell phone is used during a phone call, usually there is some motion of the handset for some amount of time in all three axes. The user will typically need to pick the phone up, turn it to see who is calling or to enter numbers on a keypad, bring the phone to his/her ear, turn the phone to adjust hearing, etc. An accelerometer can be used to detect this motion and a determination can be made that meaningful data can be collected during this time. This is just one non-limiting example of how data collection for calibration can occur automatically. As another example, if the device is equipped with a 3-axis gyroscope, the motion can also be detected by monitoring the angular rate data from the gyroscope axes. Those skilled in the art will appreciate many other examples of motion and detection that can be used to assist in data collection while keeping with the principles of the invention.

Step S110 is included in FIG. 1 to indicate that in embodiments of the invention, while the device is operating, newly collected magnetic sensor measurement data is monitored to determine if there is a new need to run the calibration logic. In such embodiments, the total field strength and inclination angle of Earth's magnetic field are continuously computed from the measured data from the magnetic sensor and an accelerometer. These two parameters for a specific location and time are fixed and can be obtained from the model. The computed values of total field strength and inclination angle are compared against the expected values obtained from the model (e.g. the IGRF model described above). If the difference between value of these parameters computed from new magnetic field measurements and the values obtained from magnetic model exceed threshold settings, a new process of calibration is started. Otherwise, in some embodiments the process can be stalled here until the difference exceeds the threshold settings.

In step S112, it is determined whether sufficient data has been collected.

In one example, this step determines if sufficient amount of data is collected while a significant component of gravity vector has been applied to each axis. In example embodiments, if a minimum of 250 data points, to maximum of 5000 data points satisfy this condition, then calibration logic can be run.

In another example, the variance on a Euclidean norm of the acceleration is also monitored. If the variance of Euclidean norm exceeds a threshold of, for example, 2 g then it means the device has experienced extreme acceleration spikes and the magnetic sensor data collected during this period would not be usable, and should be discarded.

In yet another example, the average value of total field strength is determined from the magnetic sensor from the measurements from all three axes. If the measured total field intensity is greater by more a factor of 2.5 as compared to Earth's magnetic field strength for that location, then it is a symptom of magnetic field anomaly, and so the collected data having this characteristic is discarded. A large variation in magnetic field strength when an equivalent change in acceleration measurement is not observed is another indication that a magnetic anomaly might be present. Calibration logic cannot be run for this situation, and so the collected data is discarded in this instance as well.

It should be noted that, in some embodiments, it may not be necessary that magnetic field data for all three axes to be measured. For example, if the sensor is stationary on a flat surface, the vertical axis can be calibrated and an initial offset for each horizontal axis can be estimated by comparing values with the IGRF 10 model described above.

In step S114, the collected data is processed using a calibration algorithm according to aspects of the invention.

The present inventors recognize that the three axes of magnetic sensor measurements of Earth magnetic field, when plotted for a motion in all 3 dimensions, would lie on surface of a sphere, centered at a location having coordinates x, y and z. However, various magnetic disturbances present in the environment need to be accounted for accurate measurement of heading. Soft iron effect will add non-linearity to measurements. Hard Iron effect will shift the origin of the sphere and scale factor will convert the sphere in to an ellipsoid.

Accordingly, to fully calibrate the magnetic sensor, it is necessary to calculate nine values, three for each error component described above: Hard iron effect ($x_0$, $y_0$, $z_0$); Scale factor (a, b, c); and Soft-iron effect ($\rho$, $\lambda$, $\Phi$). In this scheme, a is defined as the total scale error and $x_0$ is offset on the x-sensor; b is the total scale error and $y_0$ is offset on the y-sensor, and maintaining that the x-sensor as being perfectly aligned with the x-axis; $\rho$ is the total angular misalignment between the y-axis and the x-axis; c is the total of all scale factors on the z-sensor and $z_0$ is the total of all offsets on the z-axis; $\Phi$ is the misalignment angle between the z-sensor from the x-z plane, and $\lambda$ is the misalignment angle between the z-axis from the y-z plane.

Suppose $B_x^m$, $B_y^m$, $B_z^m$ are the values from an error free magnetic sensor in x, y, z axes. According to aspects of the invention, these values can be obtained from a model as described above. In the presence of hard-iron, soft-iron and scale factor errors, the actual measurements from magnetic sensor for the three axes are: $\tilde{B}_x, \tilde{B}_y, \tilde{B}_z$ such that $$\tilde{B}_x = aB_x^m + x_0$$

$$\tilde{B}_y = b(\cos(\rho)B_y^m + \sin(\rho)B_x^m) + y_0$$

$$\tilde{B}_z = c(\cos(\phi)\cos(\lambda)B_z^m + \sin(\lambda)B_y^m + \sin(\phi)\cos(\lambda)B_x^m) + z_0$$

These equations can be rewritten to express error-free (e.g. model) field strength measurement for each axis in terms of raw measurement as follows:

$$B_x^m = \frac{\tilde{B}_x - x_0}{a}; \quad B_y^m = \left[\left(\frac{\tilde{B}_y - y_0}{b}\right) - \left(\frac{\tilde{B}_x - x_0}{a}\right)\sin(\rho)\right]\frac{1}{\cos(\rho)};$$

-continued $$B_z^m = \left[\left(\frac{\tilde{B}_z - z_0}{c}\right) - \left(\frac{\tilde{B}_x - x_0}{a}\right)\sin(\phi)\cos(\lambda) - \right.$$
$$\left.\left[\left(\frac{\tilde{B}_y - y_0}{b}\right) - \left(\frac{\tilde{B}_x - x_0}{a}\right)\sin(\rho)\right]\frac{\sin(\lambda)}{\cos(\rho)}\right]\frac{1}{\cos(\phi)\cos(\lambda)};$$

Meanwhile, the total field strength of the Earth's magnetic field at a location (in absence of any anomalies) is constant and is not affected by the orientation of a 3-axis sensor. This total strength H can be expressed by $$(B_x^m)^2 + (B_y^m)^2 + (B_z^m)^2 = H^2$$

Substituting the expressions for error-free (e.g. model) field strength in terms of raw measurements, and then rearranging/grouping terms in the form of distorted ellipsoid gives:

$$v(1)(\tilde{B}_x)^2 + v(2)(\tilde{B}_y)^2 + v(3)(\tilde{B}_z)^2 + 2v(4)(\tilde{B}_z)(\tilde{B}_x) + 2v(5)(\tilde{B}_y)(\tilde{B}_x) + 2v(6)(\tilde{B}_z)(\tilde{B}_y) + 2v(7)(\tilde{B}_x) + 2v(8)(\tilde{B}_y) + 2v(9)(\tilde{B}_z) + v(10) = 0$$

Where v(1) to v(10) are short-hand versions of actual coefficients in terms of the error components $x_0$, $y_0$, $z_0$, a, b, c and $\rho$, $\lambda$, $\Phi$, and thus are a function of these components.

Using a constrained least squares method and the raw measurements, v(1) to v(10) can be calculated, as will be appreciated by those skilled in the art, and the error components obtained from them.

More particularly, from the calculated values of v(1) to v(10), the three offsets $x_0$, $y_0$ and $z_0$ can be obtained using the following three equations:

$$v(9) = -v(4)x_0 - v(6)y_0 - v(3)z_0$$

$$v(8) = -v(5)x_0 - v(2)y_0 - v(6)z_0$$

$$v(7) = -v(1)x_0 - v(5)y_0 - v(4)z_0$$

The three scale factors a, b and c and angular misalignment parameters $\rho$, $\lambda$, $\Phi$ can be obtained by solving the following equations:

$$\sin(\rho) = \left(\frac{v(4)v(6)}{v(3)v(2)} - \frac{v(5)}{v(2)}\right)\sqrt{\frac{v(3)v(2)}{(v(1)v(3) - v(4)^2)}}$$

$$\frac{1}{b} = \sqrt{v(2)\cos(\rho)^2 - \frac{v(6)^2}{v(3)}}$$

$$a = b\sqrt{\frac{v(3)v(2)}{(v(1)v(3) - v(4)^2)}}$$

$$\tan(\phi) = -\frac{v(4) * a}{\sqrt{v(3)}}$$

$$\tan(\lambda) = -\frac{v(6) * b * \cos(\phi)}{\sqrt{v(3)}}$$

$$c = -\frac{v(6) * b}{\sin(\lambda) * v(3)}$$

Returning to the flowchart in FIG. 1, in step S116, the validity of calculated magnetic sensor offset parameters can be determined by comparing the value of strength from the total magnetic field using the calculated offset parameters. The calculated total magnetic field strength should lie within a pre-determined threshold for the offset parameters to be valid. If the value lies outside the threshold, then the computed values of offsets are discarded and the calibration logic is executed again. Otherwise, the process advances to step S118 where the values are used to update the calibration parameters for the sensor.

Although the overall calibration process in FIG. 1 has been illustrated with specific steps and starting, ending and loop points, this illustration is intended to be explanatory rather than limiting. Those skilled in the art will recognize various alternative sequences, combinations of steps (either fewer or more), repetitions of steps and loop conditions after being taught by the above examples.

Figure 2:
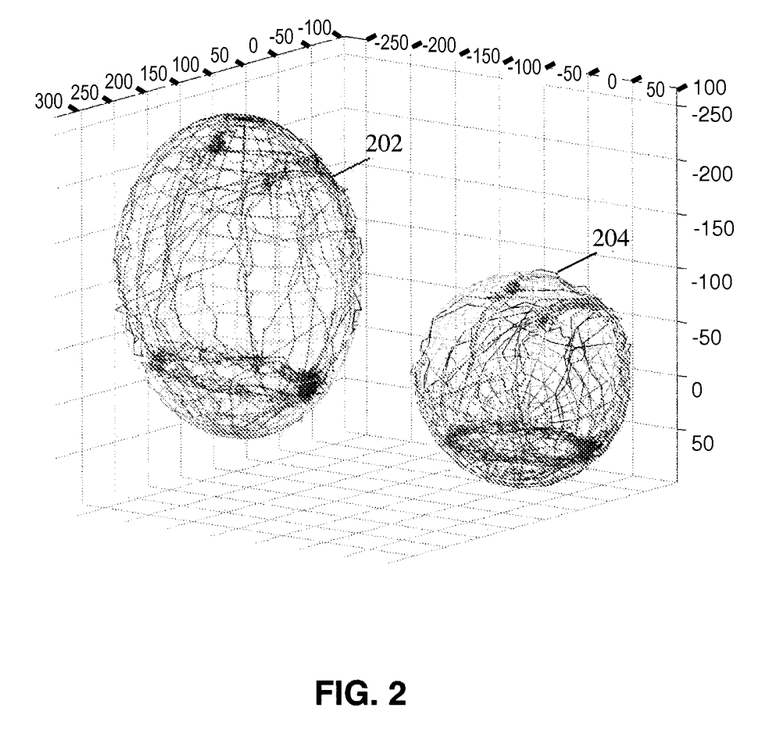
FIGS. 2 and 3 are graphs illustrating the effectiveness of the magnetic sensor calibration techniques of the invention.

FIG. 2 shows plot magnetic field strengths measured from a 3-axis magnetic sensor. The distorted ellipsoid 202 has resulted from hard iron and soft iron effects. Sensor calibration parameters obtained from the above mentioned calibration logic have been used to generate the shift from the distorted ellipsoidal to an origin centered sphere 204 whose radius is total magnetic field strength.

Figure 3:
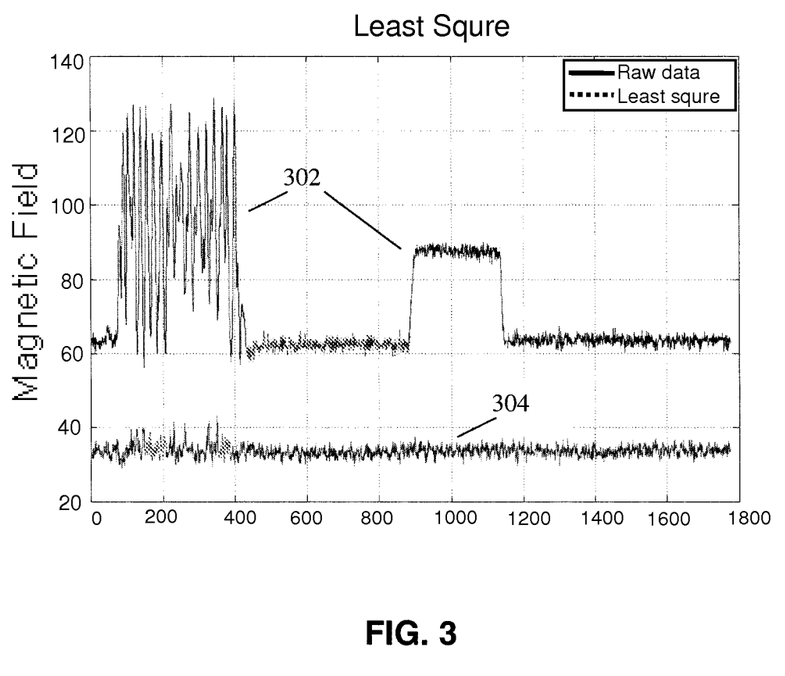

FIG. 3 shows the magnitude of the measured magnetic field vector before (302) and after (304) the calibration. The magnitude of the field vector at a particular location before the calibration is seen to vary because of incorrect estimates of calibration parameters, while the post calibration total magnetic field magnitude can be seen to be constant.

Figure 4:
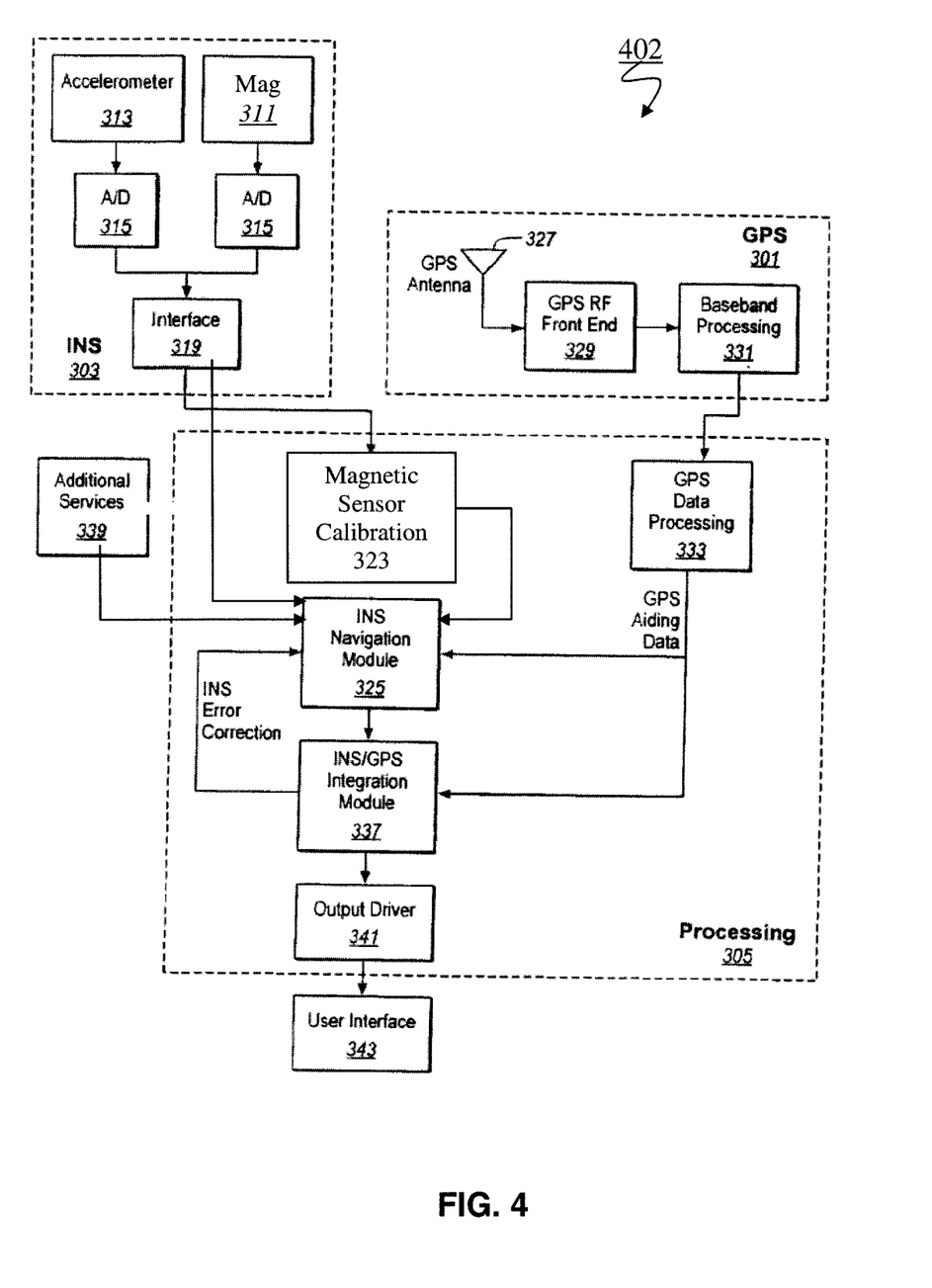
FIG. 4 is a block diagram illustrating an example navigation device incorporating and implementing the calibration techniques of the present invention.

FIG. 4 provides an example functional block diagram of a device suitable for use with the magnetic sensor calibration techniques of the invention, such as those described above. In the example of FIG. 4, device 402 includes a GPS subsystem 301, an INS (Inertial Navigation System) subsystem 303, and a signal processing subsystem 305. It can also obtain other external measurement references such as odometer and speedometer sensor data 339.

Device 402 can be a handheld/portable personal navigation device (PND, e.g. from Garmin, TomTom, etc.) or it can be a cell phone, iPhone, PDA, handheld or laptop computer, or other type of device with built-in GPS functionality, or any GPS device embedded in tracking applications (e.g. automotive tracking from Trimble, package or fleet management tracking from FedEx, child locator tracking applications etc).

The INS subsystem 303 includes magnetometer sensor(s) 311 and accelerometer sensor(s) 313. These can take many forms and configurations. For example, magnetometer sensor 311 can be a MEMS type sensor (e.g. a commercially available miniature magnetic sensor such as an AIM 604 motion sensor from Aichi Steel Corp. or a AK8974 electronic compass from Asahi-Kasei) which may or may not also include an accelerometer 313.

Measurements from sensors 311 and 313 are first applied to respective digital to analog converters 315. The digital signals are then applied to an interface 319 that allows the digital signals to be presented to the system processor 305 in the format and timing that is appropriate for the system. Properly interfaced, the digital signals are then sent to magnetic sensor calibration module 323 and INS Navigation module 325.

According to aspects of the present invention, the results from magnetic sensor calibration module 323 include calibration parameters that allow for more accurate use of measurements from magnetometer 311. This is performed using the equations and methodologies of the invention described above in connection with FIG. 1, for example, and stored in a non-volatile memory (not shown) in device 402. Such a non-volatile memory can also be used to store magnetic models such as the IGRF described above. Alternatively, module 323 can communicate with other components either within device 402 or external to the device 402 to obtain model data. Those skilled in the art will recognize various implementations that are within the scope of the invention.

As can be appreciated by those skilled in the art, the inertial navigation system 325, given an accurate initial position, maintains an accurate position for the navigation device as it moves, and without receiving GPS signals.

The GPS subsystem 301 can be used for initial position determinations and to correct the position determinations from the INS 303. In the example of FIG. 4, the GPS subsystem, in the form of a GPS receiver 301, has a GPS antenna 327, RF (Radio Frequency) front end 329, and GPS baseband signal processing 331. The antenna receives signals from a constellation of GPS satellites which are down converted in the RF front end and demodulated in the baseband processing.

The received data and timing is sent to a GPS data processing module 333 to determine the position of the navigation device. Other information can also be determined such as the rate of change of position or velocity, absolute time, GPS satellite pseudorange, Doppler frequencies and any other data that might be helpful for a particular embodiment. This data is sent to an INS/GPS integration module where it is used to aid the position determination of the INS module 325. Using this information, INS errors can be estimated in the INS/GPS integration module, and in turn, the INS subsystem provides higher accuracy.

The GPS data is also preferably provided to the INS navigation module 325. This allows for the INS navigation module to determine, for example, whether the device is in motion, accurate timing, and other information as described above. The INS navigation module 325 and the INS/GPS integration module 337 are connected together to allow the location determination to be determined iteratively. As described above, corrections from the GPS data can be provided to improve the INS data and the improved INS data can be used to provide a better position fix. While a GPS receiver is shown in FIG. 4, any other positioning system can be used as an alternative or as an addition. It should be further apparent that other satellite positioning systems can be used, such as GLONASS.

The determined position is applied from the INS/GPS Integration module to an output driver 341. The output driver applies the position to a stored map, image or any other suitable frame of reference so that the user can understand the position and use the information. The output driver is shown connected to a user interface 343. This can include a display, such as a small touch screen, to show the position results to the user. There can also be a speaker, a keypad, a microphone, a touch pad and wireless interfaces to other interface devices. The user interface allows the user to determine how the position information is to be displayed. Additional resources (not shown) can be used to determine the position of possible destinations, to compute and display routes, to show surrounding landmarks and to perform any other desired functions to further enhance the usefulness of the position determination.

The modules of the processing section can be implemented as individual ASICs (Application Specific Integrated Circuits), DSPs (Digital Signal Processors) or similar devices, each with their own instruction and operand memory and firmware. Some of the modules can be combined with the illustrated modules or with other modules not shown. Alternatively, a more general purpose controller or processor can be used to perform certain or each of these functions. The controller can include an internal memory for instructions and operands and in addition or instead can have an external memory. The controller can have dedicated circuits for performing the operations in FIG. 1 or all of these functions can be performed by general purpose circuits. The GPS and INS function blocks can be implemented as a separate GPS chip (e.g. a TITAN or PRIMA chip from SiRF Technologies, Inc.) and a separate INS or IMU chip or chips. Alternatively, they can each be integrated in whole, or in part, with the processing block.

The navigation device 402 is shown as a single system. This type of system is suitable for application to a PND, for example. However, the GPS subsystem and the INS subsystem can be separate and independent from the processing subsystem and from each other. For example, if a vehicle has any integrated sensors, these can be used by the processing subsystem. In addition, particular components, can be provided separately, such as antennas, power supplies, etc. The processing subsystem or the whole device can be provided as a PND, as a navigation component of a smartphone, a PDA (Personal Digital Assistant), or any other portable device.

The approaches described herein can be used for a wide variety of different navigation devices with differing levels of equipment and complexity. A lesser or more equipped INS, location system, and processing section than the examples described above can be preferred for certain implementations. Therefore, the configuration of the functions and the equipment can vary from implementation to implementation depending upon numerous factors, such as price constraints, performance requirements, technological improvements, or other circumstances. The particular nature of any attachment or interface with the vehicle can be adapted to the intended use of the device. Any one or more of the subsystems, interfaces, or interconnects can be eliminated from this system and others can be added. For example, information from the vehicle or from other devices can be provided based on different wired or wireless protocols.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A method for calibrating a magnetic sensor comprising:
obtaining a current location of the magnetic sensor;
obtaining location-based magnetic field values from a source different from the magnetic sensor based on the current location;
determining based on data from another sensor whether magnetic field measurements can be collected during a time when a device that includes the magnetic sensor is in motion;
obtaining magnetic field measurements from the magnetic sensor during the time when the device is in motion in response to determining that the magnetic field measurements can be collected;
extracting calibration values using the obtained location-based magnetic field values and the magnetic field measurements from the magnetic sensor; and
updating calibration parameters of the magnetic sensor using the extracted calibration values.

2. The method according to claim 1, wherein the current location comprises latitude, longitude and altitude.

3. The method according to claim 1, further comprising obtaining a current time, wherein the location-based magnetic field values are further obtained based on the current time.

4. The method according to claim 1, wherein obtaining the magnetic field measurements comprises obtaining magnetic field measurements for three orthogonal axes.

5. The method according to claim 4, further comprising detecting motion in the three orthogonal axes of a device including the magnetic sensor, wherein obtaining the magnetic field measurements is performed in conjunction with the detected motion.

6. The method according to claim 1, wherein obtaining the magnetic field measurements comprises automatically obtaining the measurements during normal operation of the device including the magnetic sensor.

7. The method according to claim 6, wherein the device includes a telephone, and wherein the normal operation includes using the telephone during a telephone call.

8. The method according to claim 1, wherein obtaining the current location includes obtaining the location from a location positioning system.

9. The method according to claim 8, wherein the location positioning system comprises GPS.

10. The method according to claim 8, wherein the location positioning system comprises WiFi.

11. The method according to claim 1 further comprising monitoring the detected motion to detect acceleration spikes above a predetermined threshold, wherein the obtained magnetic field measurements during the detected acceleration spikes are discarded.

12. The method according to claim 1, wherein obtaining the location-based magnetic field values comprises obtaining the values from a model using the current location.

13. The method according to claim 12, wherein the model comprises the International Geomagnetic Reference Field model.

14. The method according to claim 1 further comprising:
fitting the obtained magnetic field measurements to an ellipsoid, wherein fitting the obtained magnetic field measurements to an ellipsoid comprises:
expressing the magnetic field values in terms of raw measurements;
arranging terms in the expression to correspond to ellipsoid coefficients; and
using a least squares method to determine values for the ellipsoid coefficients.

15. The method according to claim 1 further comprising:
fitting the obtained magnetic field measurements to an ellipsoid, wherein fitting the obtained magnetic field measurements to an ellipsoid comprises expressing the magnetic field values in terms of raw measurements as a function of magnetic field error components.

16. The method according to claim 15, wherein the error components include components of one or more of hard iron effect, scale factor or soft iron effect.

17. The method according to claim 16, further comprising detecting motion in three orthogonal axes of a device including the magnetic sensor, wherein obtaining the magnetic field measurements is performed in conjunction with the detected motion.

18. A method implemented by one or more integrated circuits comprising:
using a magnetic sensor to obtain a heading; and
automatically calibrating the magnetic sensor during ordinary motion of a device incorporating the magnetic sensor using the one or more integrated circuits, wherein automatically calibrating comprises:
obtaining a current location of the magnetic sensor;
obtaining location-based magnetic field values from a source different from the magnetic sensor based on the current location;
determining based on data from another sensor whether magnetic field measurements can be collected during a time when the device is in motion;
obtaining magnetic field measurements from the magnetic sensor during the time when the device is in motion in response to determining that the magnetic field measurements can be collected;
extracting calibration values using the obtained location-based magnetic field values and the magnetic field measurements from the magnetic sensor; and
updating calibration parameters of the magnetic sensor using the extracted calibration values.

19. The method according to claim 18, wherein the device comprises a handheld location positioning system.

20. A device, comprising:
a magnetic sensor; and
a processor coupled to the magnetic sensor and configured with processor-executable instructions to perform operations comprising:
obtaining a current location of the magnetic sensor;
obtaining location-based magnetic field values from a source different from the magnetic sensor based on the current location;
determining based on data from another sensor whether magnetic field measurements can be collected during a time when a device that includes the magnetic sensor is in motion;
obtaining magnetic field measurements from the magnetic sensor during the time when the device is in motion in response to determining that the magnetic field measurements can be collected;
extracting calibration values using the obtained location-based magnetic field values and the magnetic field measurements from the magnetic sensor; and
updating calibration parameters of the magnetic sensor using the extracted calibration values.

21. The device of claim 20, wherein the processor is configured with processor-executable instructions to perform operations such that the current location comprises latitude, longitude and altitude.

22. The device of claim 20, wherein the processor is configured with processor-executable instructions to perform operations further comprising obtaining a current time, wherein the location-based magnetic field values are further obtained based on the current time.

23. The device of claim 20, wherein the processor is configured with processor-executable instructions to perform operations such that obtaining the magnetic field measurements comprises obtaining magnetic field measurements for three orthogonal axes.

24. The device according to claim 23, wherein the processor is configured with processor-executable instructions to perform operations further comprising detecting motion in the three orthogonal axes of a device including the magnetic sensor, wherein obtaining the magnetic field measurements is performed in conjunction with the detected motion.

25. The device of claim 20, wherein the processor is configured with processor-executable instructions to perform operations such that obtaining the magnetic field measurements comprises automatically obtaining the measurements during normal operation of the device including the magnetic sensor.

26. The device of claim 25, wherein the device includes a telephone, and wherein the processor is configured with processor-executable instructions to perform operations such that the normal operation includes using the telephone during a telephone call.

27. The device of claim 20, wherein the processor is configured with processor-executable instructions to perform operations such that obtaining the current location includes obtaining the location from a location positioning system.

28. The device of to claim 27, wherein the location positioning system comprises GPS.

29. The device of to claim 27, wherein the location positioning system comprises WiFi.

30. The device of claim 20, wherein the processor is configured with processor-executable instructions to perform operations further comprising monitoring the detected motion to detect acceleration spikes above a predetermined threshold, wherein the obtained magnetic field measurements during the detected acceleration spikes are discarded.

31. The device of claim 20, wherein the processor is configured with processor-executable instructions to perform operations such that obtaining the location-based magnetic field values comprises obtaining the values from a model using the current location.

32. The device according to claim 31, wherein the model comprises the International Geomagnetic Reference Field model.

33. The device of claim 20, wherein the processor is configured with processor-executable instructions to perform operations further comprising:
 fitting the obtained magnetic field measurements to an ellipsoid, wherein fitting the obtained magnetic field measurements to an ellipsoid comprises:
  expressing the magnetic field values in terms of raw measurements;
  arranging terms in the expression to correspond to ellipsoid coefficients; and
  using a least squares method to determine values for the ellipsoid coefficients.

34. The device of claim 20, wherein the processor is configured with processor-executable instructions to perform operations further comprising:
 fitting the obtained magnetic field measurements to an ellipsoid, wherein fitting the obtained magnetic field measurements to an ellipsoid comprises expressing the magnetic field values in terms of raw measurements as a function of magnetic field error components.

35. The device according to claim 34, wherein the processor is configured with processor-executable instructions such that the error components include components of one or more of hard iron effect, scale factor or soft iron effect.

36. The device according to claim 35, wherein the processor is configured with processor-executable instructions further comprising detecting motion in three orthogonal axes of a device including the magnetic sensor, wherein obtaining the magnetic field measurements is performed in conjunction with the detected motion.

37. A device, comprising:
 a magnetic sensor; and
 one or more integrated circuits, coupled to the magnetic sensor and configured to perform operations comprising:
  using the magnetic sensor to obtain a heading; and
  automatically calibrating the magnetic sensor during ordinary motion of the device, wherein automatically calibrating comprises:
   obtaining a current location of the magnetic sensor;
   obtaining location-based magnetic field values from a source different from the magnetic sensor based on the current location;
   determining based on data from another sensor whether magnetic field measurements can be collected during a time when the device is in motion;
   obtaining magnetic field measurements from the magnetic sensor during the time when the device is in motion in response to determining that the magnetic field measurements can be collected;
   extracting calibration values using the obtained location-based magnetic field values and the magnetic field measurements from the magnetic sensor; and
   updating calibration parameters of the magnetic sensor using the extracted calibration values.

38. The device according to claim 37, wherein the device comprises a handheld location positioning system.

* * * * *